(12) United States Patent
Xie et al.

(10) Patent No.: US 12,396,247 B2
(45) Date of Patent: Aug. 19, 2025

(54) WORK FUNCTION METAL PATTERNING FOR NANOSHEET CFETs (71) Applicant: INTERNATIONAL BUSINESS MACHINES CORPORATION, Armonk, NY (US)

(72) Inventors: Ruilong Xie, Niskayuna, NY (US); Chen Zhang, Santa Clara, CA (US); Kangguo Cheng, Schenectady, NY (US); Juntao Li, Cohoes, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 134 days.

(21) Appl. No.: 18/466,301

(22) Filed: Sep. 13, 2023

(65) Prior Publication Data
US 2024/0006245 A1 Jan. 4, 2024

Related U.S. Application Data (62) Division of application No. 16/847,908, filed on Apr. 14, 2020, now Pat. No. 11,798,851.

(51) Int. Cl.
H10D 84/03 (2025.01)
H01L 21/3065 (2006.01)
(Continued)

(52) U.S. Cl.
CPC ....... *H10D 84/038* (2025.01); *H01L 21/3065* (2013.01); *H10D 30/0245* (2025.01);
(Continued)

(58) Field of Classification Search
CPC ............... H10D 30/0245; H10D 30/01; H10D 30/0191; H10D 30/0193; H10D 30/0194; H10D 30/014; H10D 30/019; H10D 30/195; H10D 30/0196; H10D 30/0197; H10D 30/0198; H10D 30/43; H10D 30/435;
(Continued)

(56) References Cited

U.S. PATENT DOCUMENTS 5,932,895 A 8/1999 Shen et al.
7,229,873 B2 6/2007 Colombo et al.
(Continued)

OTHER PUBLICATIONS

H. Mertens et al., "Vertically stacked gate-all-around Si nanowire CMOS transistors with dual work function metal gates," 2016 IEEE International Electron Devices Meeting (IEDM), San Francisco, CA, Dec. 2016, pp. 19.7.1-19.7.4.
(Continued)

*Primary Examiner* — Michael M Trinh
(74) *Attorney, Agent, or Firm* — Tutunjian & Bitetto, P.C.; Robert Richard Aragona (57) ABSTRACT Semiconductor devices, and methods of forming the same, include forming a stack of channel layers, including an upper device region and a lower device region. The upper device region is separated from the lower device region by a dielectric spacer layer. A first work function metal layer is formed on the channel layers in the lower device region. A height of the first work function metal layer does not rise above the dielectric spacer layer. A second work function metal layer is formed on the channel layers in the upper device region.

13 Claims, 10 Drawing Sheets (51) Int. Cl.
*H10D 30/01* (2025.01)
*H10D 30/67* (2025.01)
*H10D 62/10* (2025.01)
*H10D 84/01* (2025.01)
*H10D 84/85* (2025.01)
*H10D 88/00* (2025.01)

(52) U.S. Cl.
CPC ....... *H10D 30/6735* (2025.01); *H10D 62/118* (2025.01); *H10D 84/0167* (2025.01); *H10D 84/0177* (2025.01); *H10D 84/0193* (2025.01); *H10D 84/85* (2025.01); *H10D 84/853* (2025.01); *H10D 88/00* (2025.01); *H10D 88/01* (2025.01)

(58) Field of Classification Search
CPC ..... H10D 30/501–509; H10D 30/6735; H10D 84/038; H10D 84/01; H10D 84/0167; H10D 84/0177; H10D 84/0193; H10D 84/85; H10D 84/853; H10D 84/8311; H10D 84/8312; H10D 84/83135; H10D 84/83138; H10D 84/8314; H10D 84/8316; H10D 84/835; H10D 84/836; H10D 84/837; H10D 84/839; H10D 84/851; H10D 84/852; H10D 88/00; H10D 88/01; H10D 84/02; H10D 84/03; H10D 84/035; H10D 84/05; H10D 84/07; H10D 84/08; H10D 62/118; H10D 62/121; B82Y 10/00

See application file for complete search history.

(56) References Cited

U.S. PATENT DOCUMENTS

| | | | |
|---|---|---|---|
| 10,026,652 | B2 | 7/2018 | Wang et al. |
| 10,090,193 | B1 | 10/2018 | Chanemougame et al. |
| 10,192,819 | B1 | 1/2019 | Chanemougame et al. |
| 10,192,867 | B1 | 1/2019 | Frougier et al. |
| 10,236,217 | B1 * | 3/2019 | Ando ................... H10D 62/121 |
| 10,256,158 | B1 | 4/2019 | Frougier et al. |
| 10,510,622 | B1 * | 12/2019 | Frougier ................ H10D 88/01 |
| 11,177,258 | B2 * | 11/2021 | Xie ..................... H01L 21/3065 |
| 2011/0147812 | A1 | 6/2011 | Steigerwald et al. |
| 2013/0270512 | A1 | 10/2013 | Radosavljevic et al. |
| 2017/0221708 | A1 | 8/2017 | Bergendahl et al. |
| 2019/0172755 | A1 | 6/2019 | Smith et al. |
| 2020/0006479 | A1 * | 1/2020 | Reznicek ............. H10D 86/201 |
| 2020/0403034 | A1 * | 12/2020 | Ando ................. H10N 70/8833 |

OTHER PUBLICATIONS

J. Ryckaert et al., "The Complementary FET (CFET) for CMOS scaling beyond N3," 2018 IEEE Symposium on VLSI Technology, Honolulu, HI, Jun. 2018, pp. 141-142.

List of IBM Patents or Patent Applications Treated as Related dated Sep. 13, 2023, 2 pages.

* cited by examiner

WORK FUNCTION METAL PATTERNING FOR NANOSHEET CFETs

BACKGROUND

The present invention generally relates to semiconductor device fabrication, and, more particularly, to the fabrication of nanosheet complementary field effect transistors (CFETs) with improved work function metal patterning.

As device size continues to decrease, and substantial improvements to photolithographic technologies become more difficult to obtain, opportunities for increasing device density become more rare. One approach is to stack devices, in particular in cases where the stacked devices are functionally related. For example, CFETs can use devices of two different polarities, for example an n-type FET and a p-type FET, to handle a single input signal. If the input signal is high, one of the devices is activated, but if the input signal is low, the other of the devices is activated.

However, it is difficult to form stacked CFETs. Different FET structures may be stacked, but all suffer from challenges, for example having poor power efficiency, poor structural stability, and/or difficult fabrication processes.

SUMMARY

A method of forming a semiconductor device includes forming a stack of channel layers, including an upper device region and a lower device region. The upper device region is separated from the lower device region by a dielectric spacer layer. A first work function metal layer is formed on the channel layers in the lower device region. A height of the first work function metal layer does not rise above the dielectric spacer layer. A second work function metal layer is formed on the channel layers in the upper device region.

A method of forming a semiconductor device includes forming a stack of nanosheet semiconductor channel layers, including an upper device region and a lower device region. The upper device region is separated from the lower device region by a dielectric spacer layer. Lower source/drain regions, having a first conductivity type, are formed on sidewalls of the channel layers in the lower device region. Upper source/drain regions, having a second conductivity type that is different from the first conductivity type, are formed on sidewalls of the channel layers in the upper device region. A first work function metal layer, having the first conductivity type, is formed on the channel layers in the lower device region. A height of the first work function metal layer does not rise above the dielectric spacer layer. A second work function metal layer, having the second conductivity type, is formed on the channel layers in the upper device region.

A semiconductor device includes a stack of channel layers, including an upper device region and a lower device region. The upper device region is separated from the lower device region by a dielectric spacer layer. A first work function metal layer is formed on the channel layers in the lower device region. A height of the first work function metal layer does not rise above the dielectric spacer layer. A second work function metal layer is formed on the channel layers in the upper device region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide nanosheet complementary field effect transistors (CFETs) that have improved work function metal patterning. Nanosheet devices are selected herein to provide good power efficiency and structural stability. However, the fabrication of stacked nanosheet CFETs is challenging, due to the difficulty of selectively masking the devices. The close proximity of the upper device to the lower device can cause the masking material to pinch off and incompletely fill the space between the two devices. Then, when the upper device is processed, the incomplete mask can result in damage to the lower device, decreasing device yield. This is due to the relatively large width of nanosheet channels, which makes it difficult for the mask material to fill in completely.

The present embodiments make use of a sacrificial layer between the upper device and the lower device. This sacrificial layer creates a greater distance between the lowest channel layer of the upper device and the highest channel layer of the lower device. The sacrificial layer can then be used to help completely mask the lower device while the upper device is being processed, for example for the deposition of a different work function metal.

Figure 1:
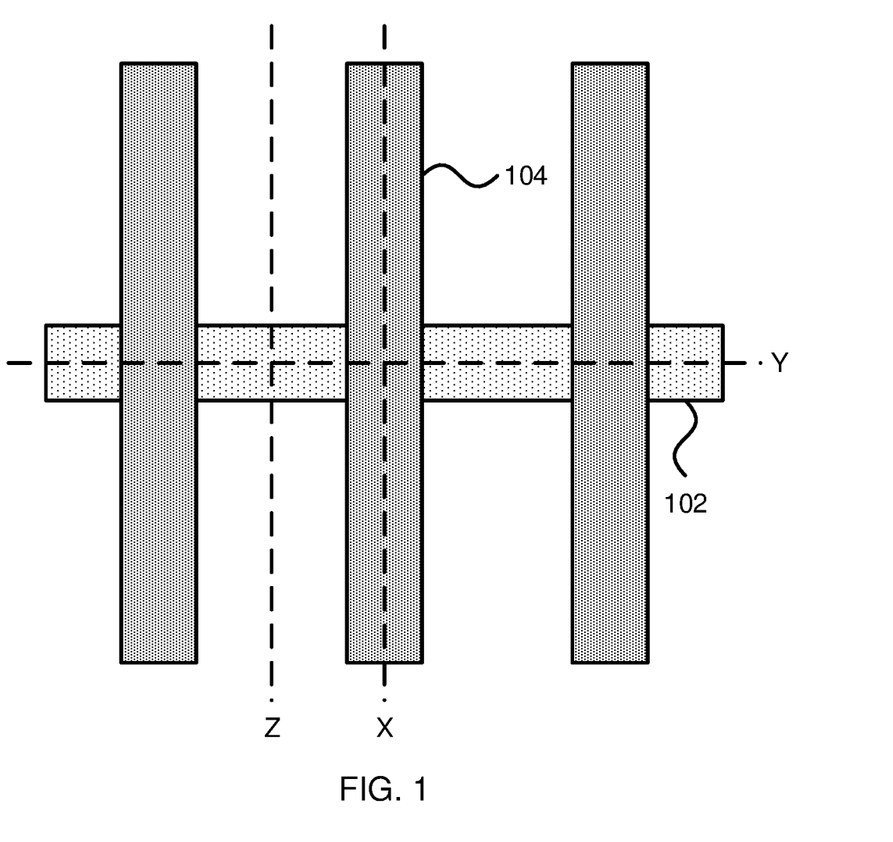
FIG. 1 is a top-down view of a fin and dummy gates for the formation of nanosheet complementary field effect transistors (CFETs) with improved work function metal patterning, that defines cross-sectional planes in accordance with an embodiment of the present invention.

Referring now to the drawings in which like numerals represent the same or similar elements and initially to FIG. 1, a top-down view of a device is shown. This view establishes three different cross-sectional planes: X indicates a cross-sectional view that cuts transversely across a fin 102, and longitudinally along a gate structure 104, Y indicates a cross-sectional view that cuts longitudinally along the fin 102, and transversely across the gate structure 104, and Z indicates a cross-sectional view that cuts transversely across the fin 102, between adjacent gate structures 104. The following figures will show both views, side by side, to illustrate a step-by-step process for forming nanosheet CFETs according to the present embodiments. It should be understood that the present figures are not drawn to a realistic scale, nor are they intended to represent a consistent scale between the figures.

Figure 2:
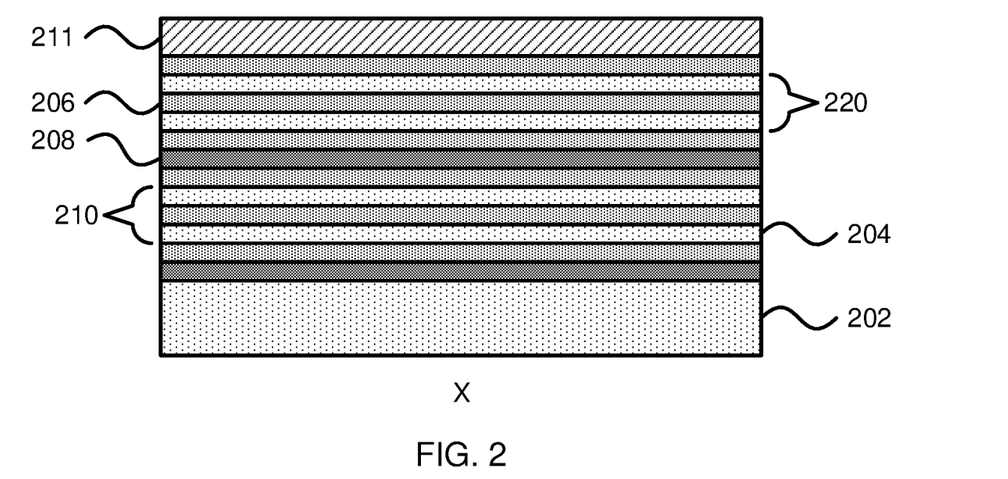
FIG. 2 is a cross-sectional view of a step in the formation of nanosheet CFETs with improved work function metal patterning, showing a stack of layers of channel material and two different sacrificial materials, in accordance with an embodiment of the present invention.

Referring now to FIG. 2, a cross-sectional view of a step in the fabrication of nanosheet CFETs is shown. A stack of semiconductor layers is formed on a semiconductor substrate 202. The semiconductor layers include channel layers 204, first sacrificial layers 206, and second sacrificial layers 208. It is specifically contemplated that each successive layer may be epitaxially grown from the previous layer, but it should be understood that other methods of deposition may be employed instead. A hardmask layer 211 is formed over the stack from any appropriate hardmask material, such as silicon nitride. The layers define a lower device region 210 and an upper device region 220, formed from respective sets of channel layers 204.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

As noted above, the semiconductor layers may be epitaxially grown from the semiconductor substrate. The terms "epitaxial growth" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

In embodiments where the semiconductor substrate 102 is formed from silicon, the semiconductor layers can be formed from silicon or silicon germanium, which can be selectively etched with respect to one another, and which have compatible crystal structures. In some embodiments, the channel layers 204 can be formed from silicon, the first sacrificial layers 206 can be formed from silicon germanium at a first germanium concentration, and the second sacrificial layers 208 can be formed from silicon germanium at a second germanium concentration. In some embodiments, the first sacrificial layers 206 may have a germanium concentration of about 35%, and the second sacrificial layers 208 may have a germanium concentration of about 65%, but it should be understood that these concentrations are purely exemplary and should not be considered to be limiting.

The germanium concentration in silicon germanium controls how rapidly the layer can be removed under certain etches, making these layers selectively etchable with respect to one another. As used herein, the term "selective" in reference to a material removal process denotes that the rate of material removal for a first material is greater than the rate of removal for at least another material of the structure to which the material removal process is being applied.

Figure 3:
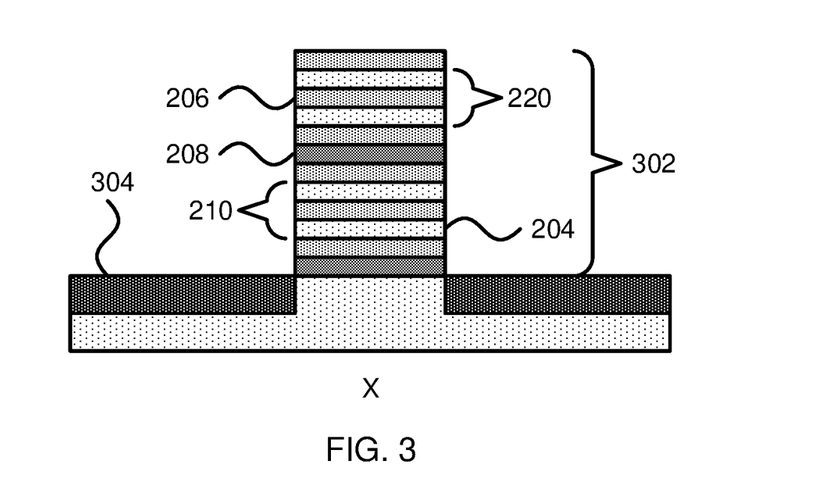
FIG. 3 is a cross-sectional view of a step in the formation of nanosheet CFETs with improved work function metal patterning, showing the patterning of a fin from the stack of layers, in accordance with an embodiment of the present invention.

Referring now to FIG. 3, a cross-sectional view of a step in the fabrication of nanosheet CFETs is shown. The mask layer 211 is patterned using any appropriate process, for example using a photolithographic process or sidewall image transfer. One or more anisotropic etches are then used to etch down into the stack of semiconductor layers, stopping at the semiconductor substrate 202, to form a fin 302 of stacked semiconductor layers. The anisotropic etches can include, for example, reactive ion etching (RIE). After formation of the fins 302, the regions around the fins can be replaced with shallow trench isolation (STI) structures 304. The STI structures can be formed by, e.g., etching trenches into the semiconductor substrate 202, followed by deposition of an STI material, such as a silicon oxide. After that, the hardmask layer 211 can then be selectively etched away, using any appropriate selective etch. It is specifically contemplated that the fin 302 can be patterned to form nanosheets from the stacked semiconductor layers. As used herein, the term "nanosheet" is used to denote a structure that has a width-to-height ratio on the X cross-section that is at least 2:1.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 4:
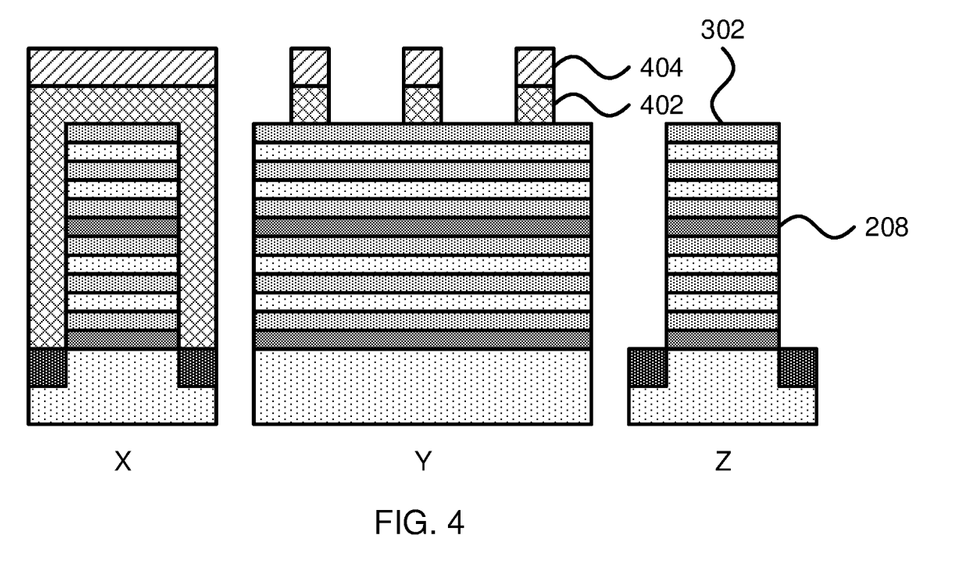
FIG. 4 is a set of cross-sectional views of a step in the formation of nanosheet CFETs with improved work function metal patterning, showing the formation of dummy gates over the fin, in accordance with an embodiment of the present invention.

Referring now to FIG. 4, a set of cross-sectional views of a step in the fabrication of nanosheet CFETs are shown. Dummy gates 402 are formed over the fin 302. A layer of dummy gate material, such as a thin layer of oxide followed by polycrystalline silicon, is deposited over the fins 302. A hardmask 404 is then formed by any appropriate process, such as a photolithographic process or a sidewall image transfer process. The dummy gates 402 can then be formed by selectively and anisotropically etching the dummy gate material around the hardmask 404.

Figure 5:
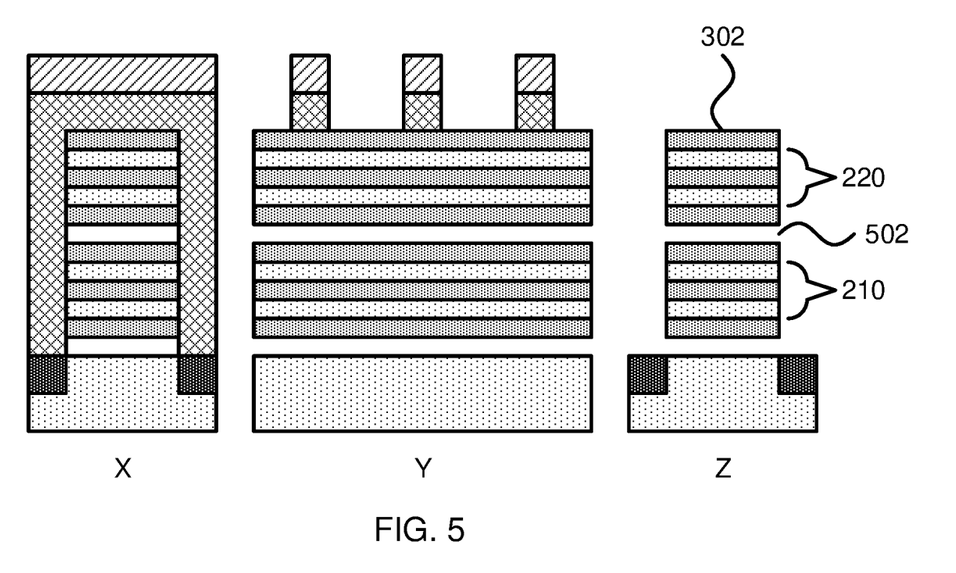
FIG. 5 is a set of cross-sectional views of a step in the formation of nanosheet CFETs with improved work function metal patterning, showing the removal of one set of sacrificial layers to form gaps in the fin, in accordance with an embodiment of the present invention.

Referring now to FIG. 5, a set of cross-sectional views of a step in the fabrication of nanosheet CFETs are shown. The second sacrificial layers 208 are selectively etched away, leaving the channel layers 204 and the first sacrificial layers 206. The resulting gaps 502 separate the lower device region 210 from the upper device region 220. In embodiments that use silicon germanium for the sacrificial layers, the higher concentration in the second sacrificial layers 208 results in the etch of these layers proceeding much faster than for the first sacrificial layers 206 and the channel layers 204.

Figure 6:
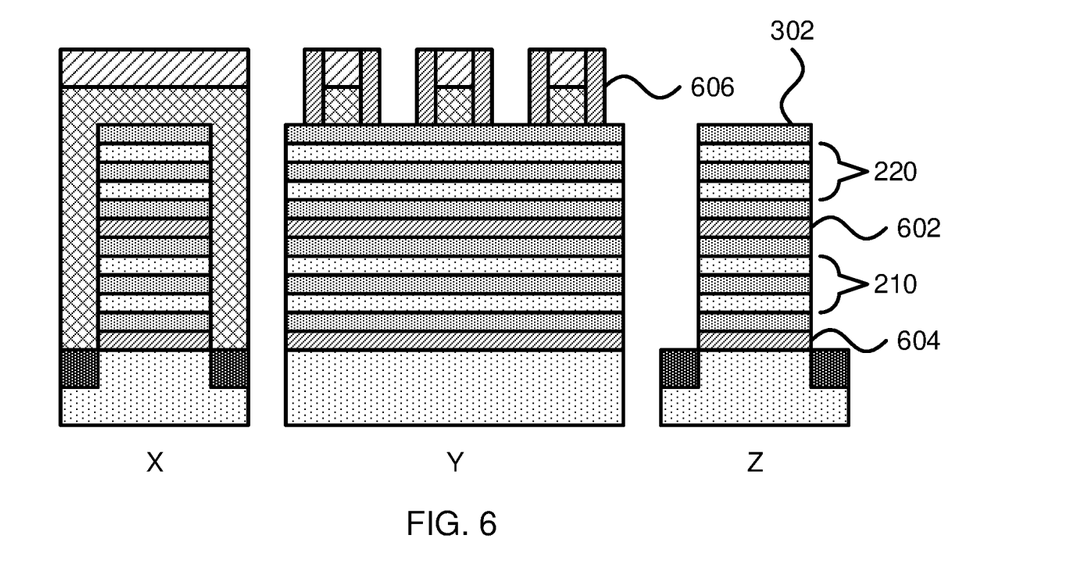
FIG. 6 is a set of cross-sectional views of a step in the formation of nanosheet CFETs with improved work function metal patterning, showing the formation of a dielectric spacer layer in the gaps to separate an upper device region from a lower device region, in accordance with an embodiment of the present invention.

Referring now to FIG. 6, a set of cross-sectional views of a step in the fabrication of nanosheet CFETs are shown. Spacer material is conformally deposited to fill the gaps 502 to form middle spacer 602, bottom spacer 604, and dummy gate spacers 606. The spacer material can be masked and anisotropically etched, as appropriate, to preserve the dummy gate spacers 606 while removing the spacer material from the sidewalls of the fins 302. It is specifically contemplated that the spacer material can be distinct from the material of the hardmasks 404, and that the two materials may be selectively etchable with respect to one another. For example, one material may be formed from silicon nitride, while the other may be formed from SiOCN.

Figure 7:
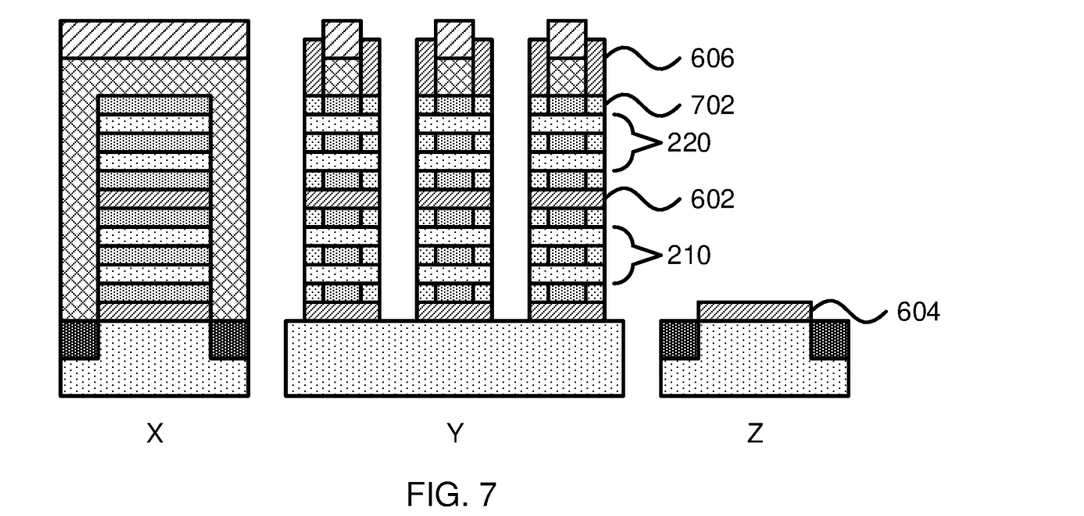
FIG. 7 is a set of cross-sectional views of a step in the formation of nanosheet CFETs with improved work function metal patterning, showing the anisotropic etch of the fin in areas that are not covered by the dummy gates, in accordance with an embodiment of the present invention.

Referring now to FIG. 7, a set of cross-sectional views of a step in the fabrication of nanosheet CFETs are shown. The fins 302 are etched away in the regions between the dummy gates, leaving the bottom spacer 604 in that region intact. A series of selective anisotropic etches can be used to remove the different layers. The first sacrificial layers 206 can be recessed relative to the channel layers 204, and inner spacers 702 can be formed in the recesses.

The formation of inner spacers 702 can be performed in a variety of ways. In some embodiments, a selective etch can be used to recess the first sacrificial layers 206. A layer of dielectric material, such as silicon nitride, can then be conformally deposited to fill the recesses, and material outside the protection of the recesses can be isotropically etched away. In other embodiments, a condensation process can be used to selectively oxidize the end surfaces of the first sacrificial layers 206, which draws silicon out of silicon germanium to form silicon dioxide.

Figure 8:
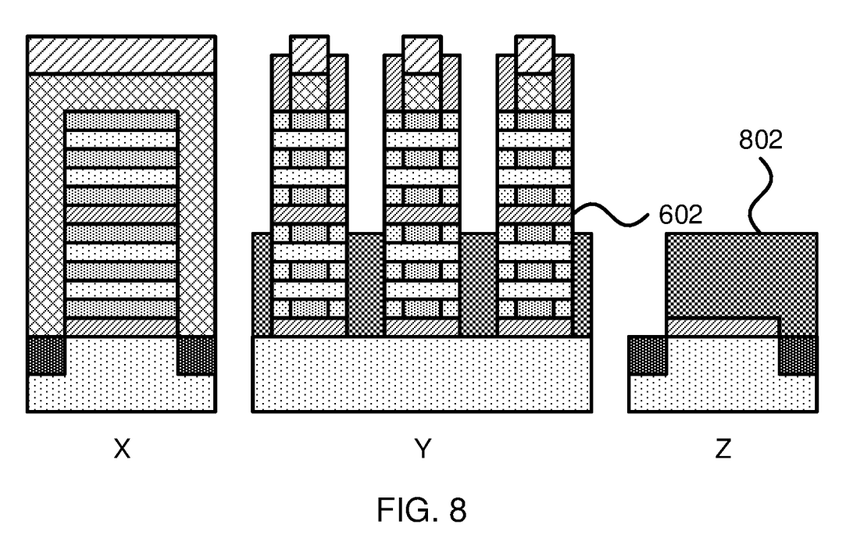
FIG. 8 is a set of cross-sectional views of a step in the formation of nanosheet CFETs with improved work function metal patterning, showing the formation of a lower source/drain region, in accordance with an embodiment of the present invention.

Referring now to FIG. 8, a set of cross-sectional views of a step in the fabrication of nanosheet CFETs are shown. Lower source/drain regions 802, for the lower device 210, are epitaxially grown from sidewalls of the channel layers 204. After the epitaxial material is grown, any epitaxial material formed over top nanosheets is etched back, below the height of the middle spacer 602. Additionally, the epitaxial material can be masked and etched down to the underlying STI 304 for the portion where it is not needed.

The lower source/drain regions 802 can be doped in situ during epitaxial growth, or by an ion implantation process. The dopants used for the lower source/drain regions 802 will belong to a first dopant conductivity type. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. In some embodiments, the lower source/drain regions 802 may therefore be either n-type or p-type.

Figure 9:
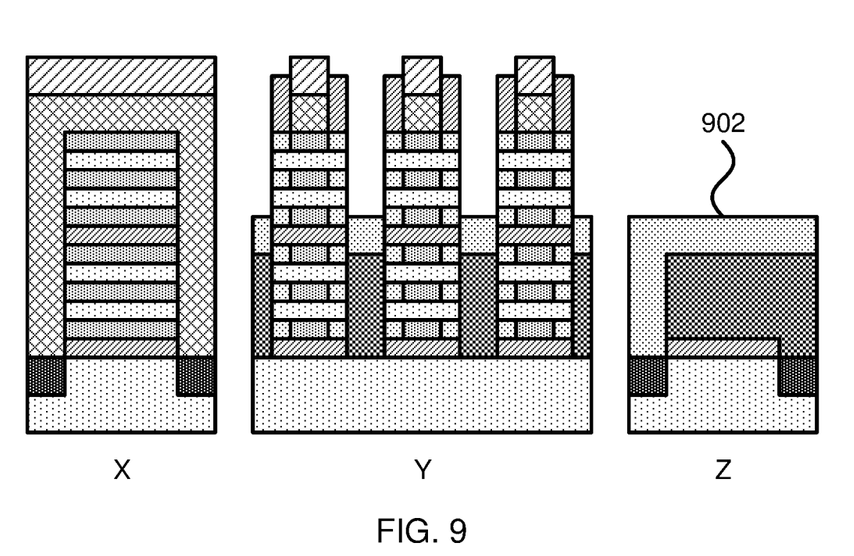
FIG. 9 is a set of cross-sectional views of a step in the formation of nanosheet CFETs with improved work function metal patterning, showing the formation of an isolation layer over the lower source/drain region, in accordance with an embodiment of the present invention.

Referring now to FIG. 9, a set of cross-sectional views of a step in the fabrication of nanosheet CFETs are shown. An isolation layer 902 is deposited to a height that exceeds the height of the middle spacer layer 602, while leaving the channel layers 204 of the upper device region 220 exposed. The isolation layer 902 can be formed from any appropriate dielectric material, for example silicon dioxide or a low-k dielectric material. As used herein, the term "low-k" refers to a material that has a dielectric constant k that is lower than the dielectric constant of silicon dioxide. Low-k materials can be used to minimize parasitic capacitances. One way to form 902 is to overfill the space with 902 first, CMP, and recess to the level, such that top nanosheets are revealed while bottom epitaxial material is still covered by 902.

Figure 10:
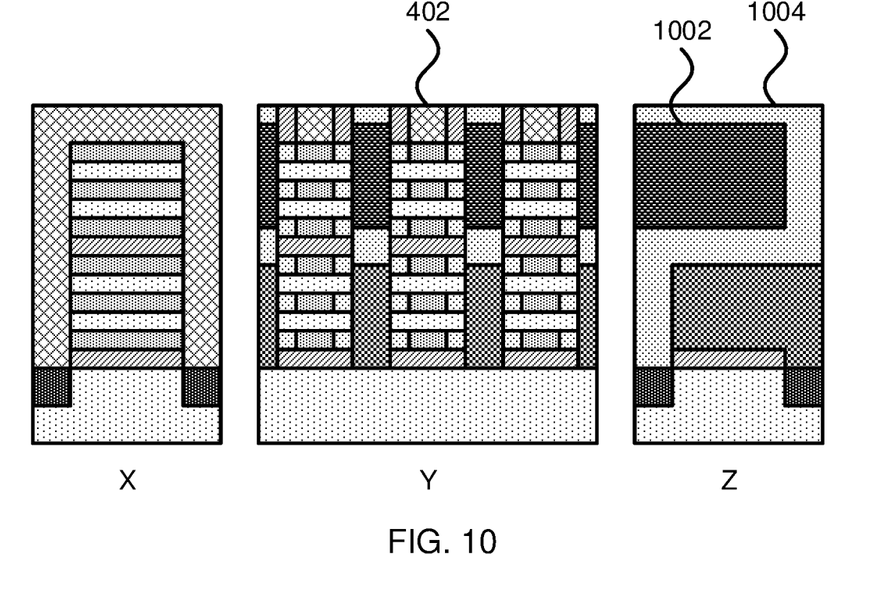
FIG. 10 is a set of cross-sectional views of a step in the formation of nanosheet CFETs with improved work function metal patterning, showing the formation of an upper source/drain region, in accordance with an embodiment of the present invention.

Referring now to FIG. 10, a set of cross-sectional views of a step in the fabrication of nanosheet CFETs are shown. Upper source/drain regions 1002 are epitaxially grown from exposed sidewalls of the channel layers 204 in the upper device region 220. Additional dielectric material is deposited around the upper source/drain regions 1002, for example formed from the same material as the isolation layer 902, to extend the isolation layer 1004. The dielectric material can then be polished down to the level of the hardmasks 404 using, e.g., a chemical mechanical planarization (CMP) process.

CMP is performed using, e.g., a chemical or granular slurry and mechanical force to gradually remove upper layers of the device. The slurry may be formulated to be unable to dissolve, for example, the dummy gates 402, resulting in the CMP process's inability to proceed any farther than that layer.

Whereas the lower source/drain regions 802 were formed from a first conductivity type, the upper source/drain regions 1002 may be formed from a second, opposite conductivity type. In this manner, a CFET can be formed, for example with a p-type FET on the bottom and an n-type FET at the top.

The upper source/drain regions 1002 can be patterned and etched, with some lateral displacement between the position of the lower source/drain regions 802 and the upper source/drain regions 1002. This leaves room for the formation of conductive contacts, down through the isolation layer 1004, to reach the lower source/drain regions 802.

Figure 11:
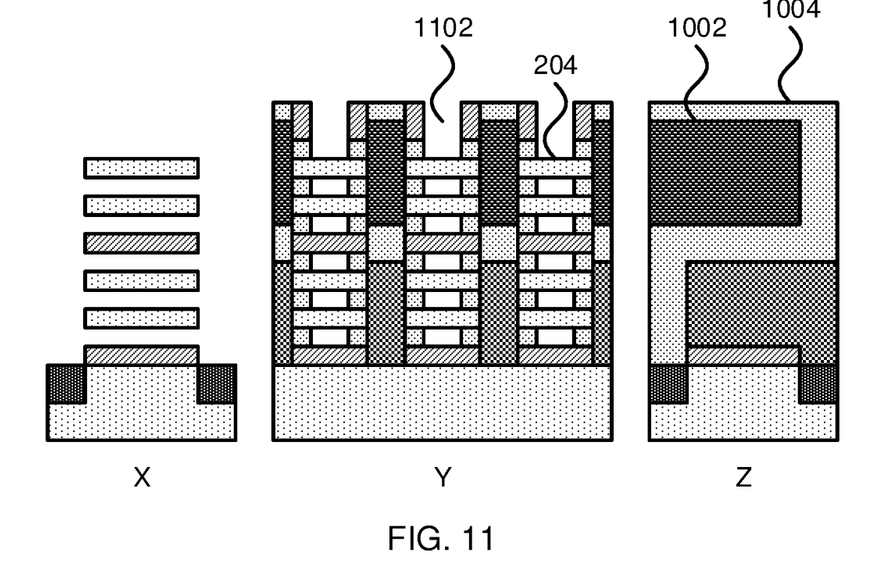
FIG. 11 is a set of cross-sectional views of a step in the formation of nanosheet CFETs with improved work function metal patterning, showing the removal of the dummy gates, in accordance with an embodiment of the present invention.

Referring now to FIG. 11, a set of cross-sectional views of a step in the fabrication of nanosheet CFETs are shown. The dummy gates 402 are selectively etched away, followed by the first sacrificial layers 206. The latter etch in particular can be performed with a selective isotropic etch, which removes the sacrificial material from between the channel layers 204. This forms a gap 1102 where the sacrificial layers were, including space between vertically adjacent channel layers 204.

Figure 12:
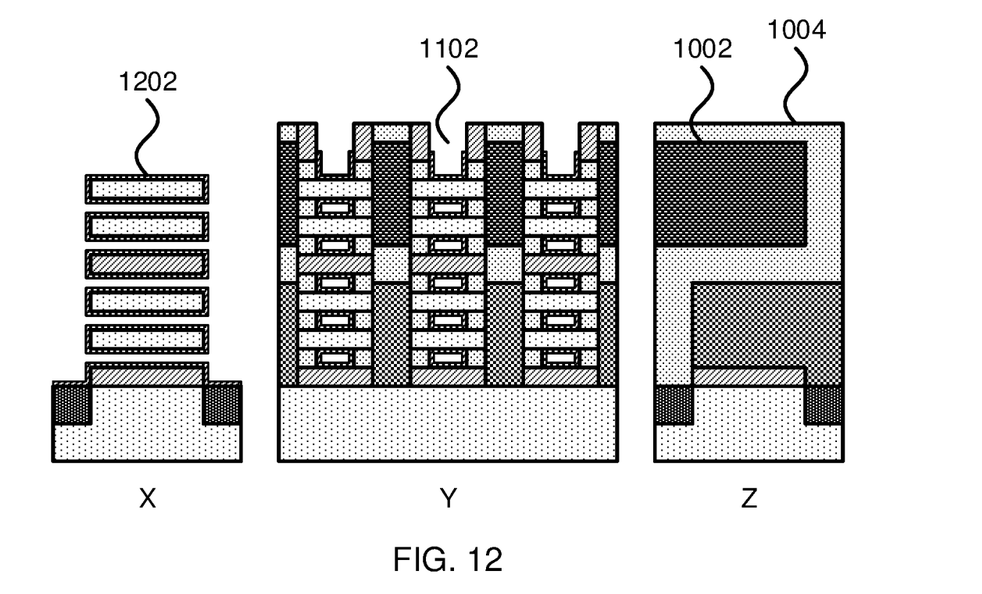
FIG. 12 is a set of cross-sectional views of a step in the formation of nanosheet CFETs with improved work function metal patterning, showing the formation of a gate dielectric layer, in accordance with an embodiment of the present invention.

Referring now to FIG. 12, a set of cross-sectional views of a step in the fabrication of nanosheet CFETs are shown. A gate dielectric 1202 is formed in the gaps 1102, for example by a conformal deposition process. The gate dielectric 1202 adheres to the surfaces of the channel layers 204, including in the spaces between the channel layers 204. In some embodiments, the gate dielectric layer 1202 may be chamfered, by partially filling the gaps 1102 with a sacrificial material and etching back the portions of the gate dielectric material that remain exposed. The sacrificial material can then be etched away.

The gate dielectric 1202 can be formed from any appropriate dielectric material, but it is specifically contemplated that a high-k dielectric material may be used. As used herein, the term "high-k" refers to a material that has a dielectric constant k that is greater than the dielectric constant of silicon dioxide. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

Figure 13:
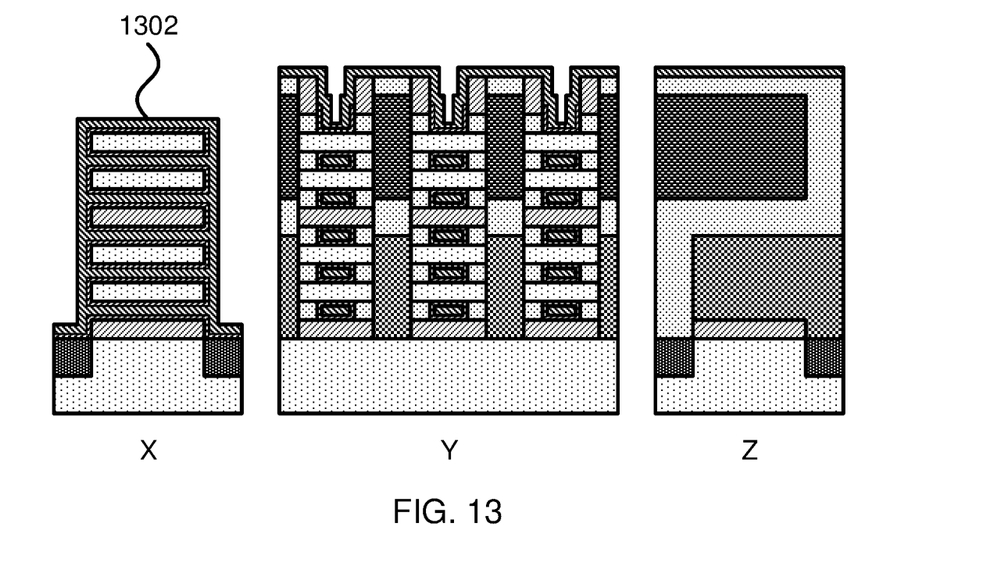
FIG. 13 is a set of cross-sectional views of a step in the formation of nanosheet CFETs with improved work function metal patterning, showing formation of a first work function metal layer, in accordance with an embodiment of the present invention.

Referring now to FIG. 13, a set of cross-sectional views of a step in the fabrication of nanosheet CFETs are shown. A first work function metal layer 1302 is conformally deposited in the gap 1102, particularly in the spaces between the channel layers 204. Notably, the first work function metal layer 1302 need not necessarily pinch off in the spaces between the channel layers 204, and additional conductive material may filled into any remaining gaps in such embodiments.

The first work function metal layer 1302 may be formed from either a p-type or n-type work function metal. As used herein, a "p-type work function metal" is a metal that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, a p-type work function metal layer may be formed from titanium nitride, titanium aluminum nitride, ruthenium, platinum, molybdenum, cobalt, and alloys and combinations thereof.

As used herein, an "n-type work function metal" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is formed from at least one of titanium aluminum, tantalum nitride, titanium nitride, hafnium nitride, hafnium silicon, or combinations thereof. It should be understood that titanium nitride may play the role of an n-type work function metal or a p-type work function metal, depending on the conditions of its deposition.

The conductivity type of the first work function metal layer 1302 is selected to match the conductivity type of the lower source/drain region 802. Thus, if the lower source/drain region 802 is doped with a p-type dopant, then a p-type work function metal is selected for the first work function metal layer 1302. Similarly, if the lower source/drain region 802 is doped with an n-type dopant, then an n-type work function metal layer is selected.

Figure 14:
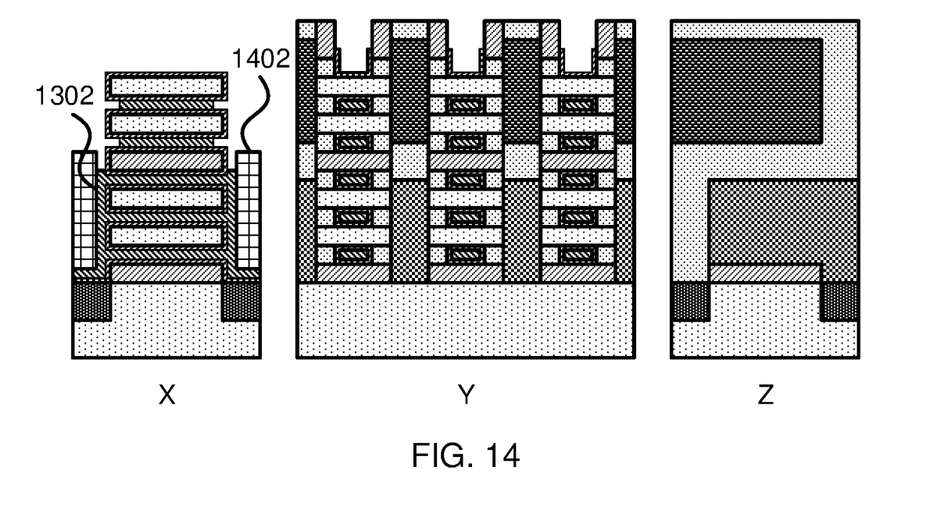
FIG. 14 is a set of cross-sectional views of a step in the formation of nanosheet CFETs with improved work function metal patterning, showing the etch back of the first work function metal layer in the upper device region, in accordance with an embodiment of the present invention.

Referring now to FIG. 14, a set of cross-sectional views of a step in the fabrication of nanosheet CFETs are shown. A first sacrificial layer 1402 can be deposited around the first work function layer 1302 and then etched back. The height of the sacrificial layer can be at a level around the height of the middle spacer 602. The exposed portions of the first work function metal layer 1302 can then be etched back using an isotropic etch. The etch is stopped to prevent overetching the material in the lower device region 210, which results in some work function metal remaining between the channel layers 204 of the upper device region 220.

The first sacrificial layer 1402 may be an organic planarizing layer (OPL) and can include an organic polymer that, when exposed to electromagnetic (EM) radiation, changes chemically to be removable by a developing solvent. Examples of organic polymers may include polyacrylate resin, epoxy resin, phenol resin, polyamide resin, polyimide resin, unsaturated polyester resin, polyphenylenether resin, polyphenylenesulfide resin, or benzocyclobutene. More generally, the first sacrificial layer 1402 may be formed from any organic polymer and a compound having a molecular structure that can attach to the molecular structure of the organic polymer. The first sacrificial layer 1402 may, for example, be applied using spin coating technology or a flowable CVD process.

Figure 15:
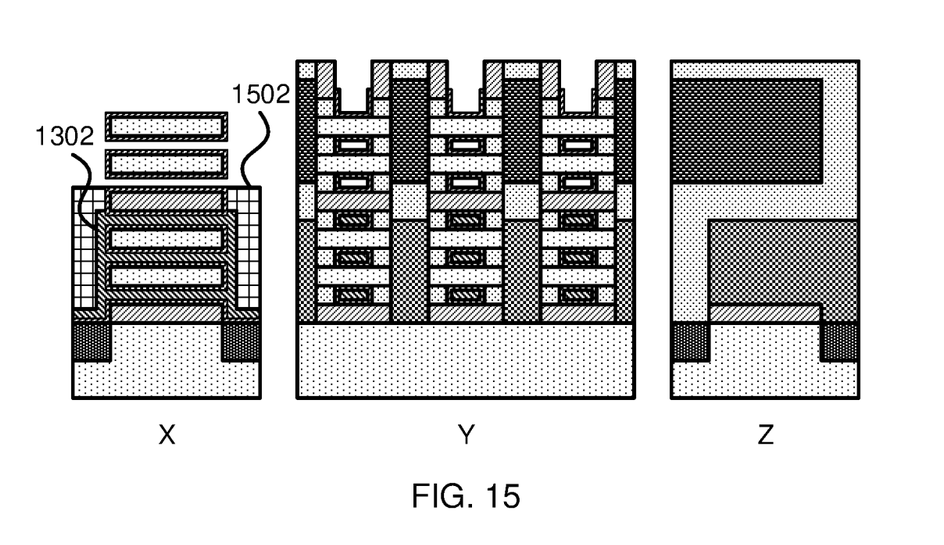
FIG. 15 is a set of cross-sectional views of a step in the formation of nano sheet CFETs with improved work function metal patterning, showing a blocking layer being reformed around the lower device region and the removal of remaining portions of the first work function metal layer from the upper device region, in accordance with an embodiment of the present invention.

Referring now to FIG. 15, a set of cross-sectional views of a step in the fabrication of nanosheet CFETs are shown. The first sacrificial layer 1402 is selectively removed, for example by ashing the OPL material, and a second sacrificial layer 1502 is formed. The second sacrificial layer 1502 has a height at least as high as the bottom surface of the middle spacer 602. The portions of the first work function material that remained between the channel layers 204 of the upper device region 220 can then be selectively removed using an aggressive isotropic etch, without damaging the first work function metal layer 1302 in the lower device region 210.

Figure 16:
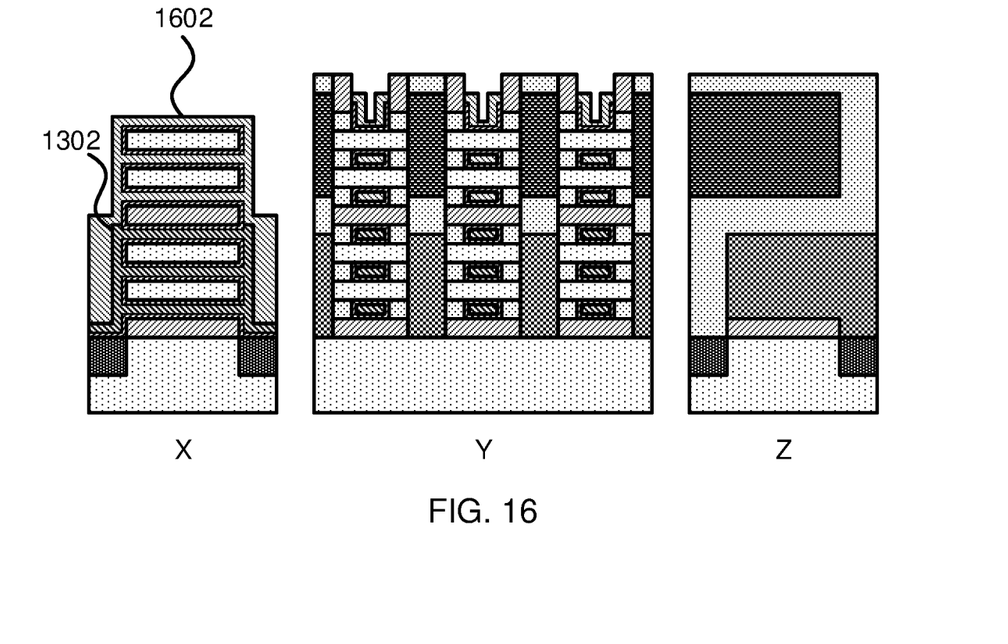
FIG. 16 is a set of cross-sectional views of a step in the formation of nanosheet CFETs with improved work function metal patterning, showing the formation of a second work function metal layer, in accordance with an embodiment of the present invention.

Referring now to FIG. 16, a set of cross-sectional views of a step in the fabrication of nanosheet CFETs are shown. A second work function metal layer 1602 is conformally deposited, filling the spaces between the channel layers 204 of the upper device region 220. Because the effect of the work function metals is achieved by contact with the channel, electrical contact between the first work function metal layer 1302 and the second work function metal layer 1602 is permissible. The second work function metal layer 1602 can be chamfered by filling in a sacrificial material, etching back exposed portions of the second work function metal, and removing the sacrificial material. The material of the second work function metal layer 1602 is selected to match the conductivity type with the upper source/drain regions 1002, and to have an opposite conductivity type as compared to the conductivity type of the first work function metal layer 1302.

Figure 17:
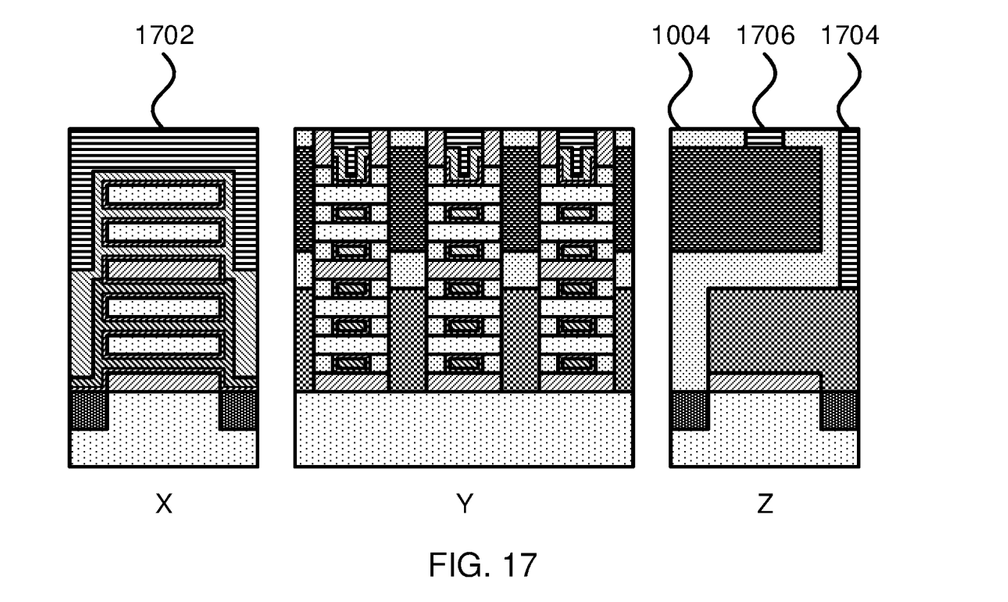
FIG. 17 is a set of cross-sectional views of a step in the formation of nanosheet CFETs with improved work function metal patterning, showing the formation of conductive contacts, in accordance with an embodiment of the present invention.

Referring now to FIG. 17, a set of cross-sectional views of a step in the fabrication of nanosheet CFETs are shown. A gate contact 1702 is formed over the second work function metal layer 1602. Vias are formed in the isolation layer 1004 and conductive material is deposited to form lower source/drain regions 1704 and upper source/drain regions 1706. These contacts can be formed from any appropriate conductive material. Exemplary conductive materials may include, e.g., tungsten, nickel, titanium, molybdenum, tantalum, copper, platinum, silver, gold, ruthenium, iridium, rhenium, rhodium, cobalt, and alloys thereof. Alternatively, a doped semiconductor material may be used, such as, e.g., doped polysilicon.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 18:
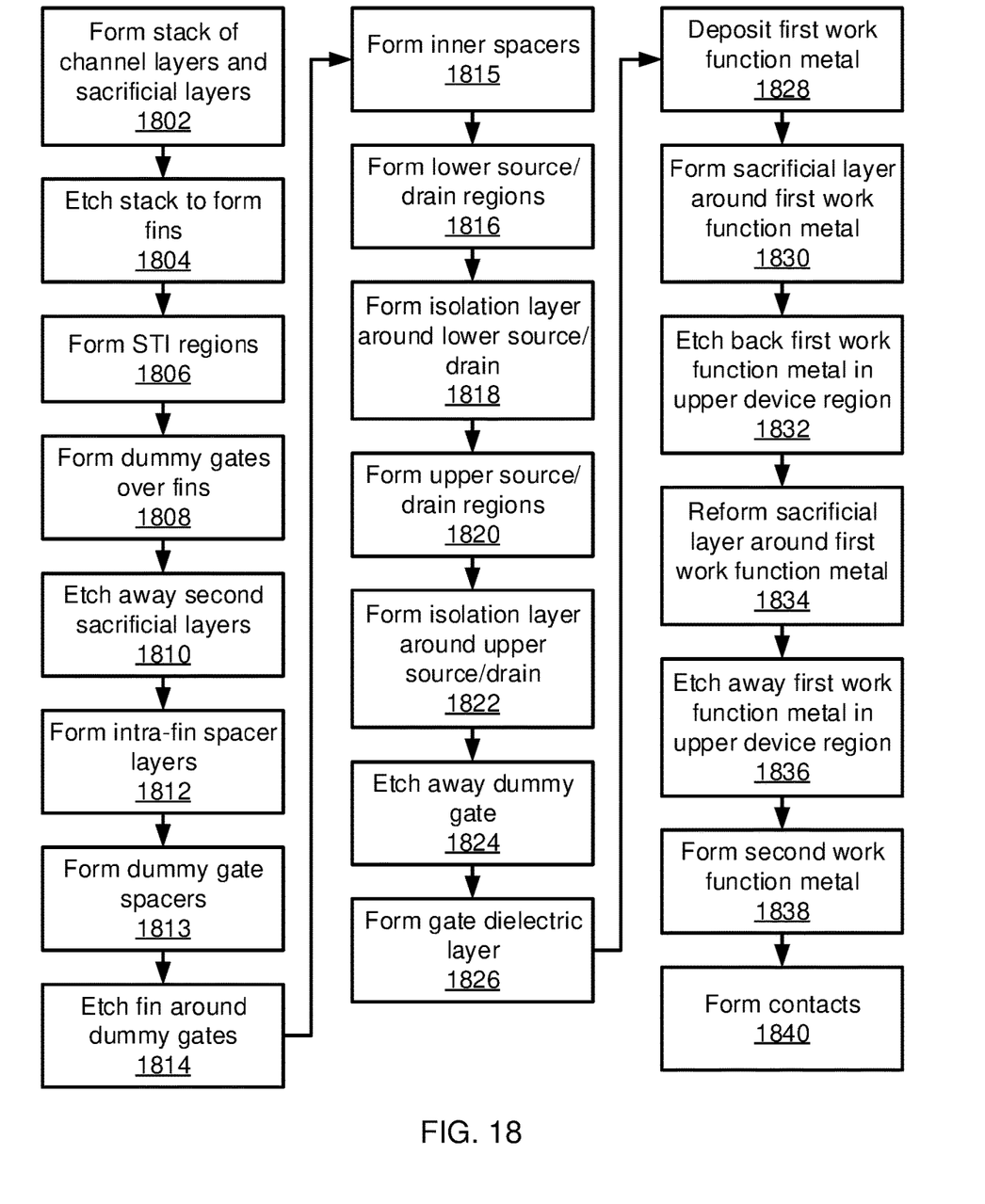
FIG. 18 is a block/flow diagram of a method of forming nanosheet CFETs with improved work function metal patterning, in accordance with an embodiment of the present invention.

Referring now to FIG. 18, a method of forming nanosheet CFETs is shown. Block 1802 forms a stack of semiconductor layers on a semiconductor substrate 202. The semiconductor layers include channel layers 204, first sacrificial layers 206, and second sacrificial layers 208, and it is specifically contemplated that the stack may be formed by epitaxially growing each new layer from the top surface of the previous layer. Block 1804 masks and anisotropically etches the stack of layers to form a fin 302. Block 1806 forms STI regions around the fin 302, for example by forming trenches in the semiconductor substrate 202 and then filling the trenches with an electrically insulating material.

Block 1808 forms dummy gates 402 over the fins 302. Block 1810 etches away the second sacrificial layers 208 using a selective isotropic etch, and then block 1812 forms spacer layers 602 and 604 in the gaps in the resulting fins 302. Block 1813 forms spacers 606 on the sidewalls of the dummy gates 404, for example in the same deposition process that forms the intra-fin spacers. Block 1814 anisotropically etches the fin 302 in the exposed regions around the dummy gates 402 and the dummy gate sidewall spacers 606. Block 1815 recesses the first sacrificial layers 206 and forms inner spacers 702 in the recesses.

Block 1816 forms lower source/drain regions 802, for example by epitaxially growing these structures from the exposed side surfaces of the channel layers 204. The resulting structure can be etched back to the lower device region 210, and can furthermore be patterned to an appropriate shape. Block 1818 forms an isolation layer over and around the lower source/drain regions 802. Block 1820 forms upper source/drain regions 1002, for example by epitaxial growth from the exposed side surfaces of the channel layers 204 in the upper device region 220. Block 1822 extends forms additional isolation layer 1004 to cover the upper source/drain regions 1002. In some embodiments, these source/drain regions can be doped in situ or by ion implantation, and the dopant conductivity types of the respective source/drain regions may be opposite to one another.

Block 1824 etches away the dummy gate 1824, thereby exposing the surfaces of the channel layers 204. Block 1826 forms a gate dielectric layer 1202 by conformal deposition on these exposed surfaces. Block 1828 deposits a first work function metal layer 1302 over, around, and between the channel layers 204 and the middle spacer 602. Block 1830 forms a first sacrificial layer 1402 around the fins 302, and block 1832 then partially etches back the first work function metal layer 1302. The first sacrificial layer 1402 is removed in block 1834 and is replaced with second sacrificial layer 1502, which protects the first work function metal layer 1302 from subsequent etches. Block 1836 fully etches away remaining first work function metal from between the channel layers 204 in the upper device region 220. Block 1838 then forms second work function metal layer 1602 over, around, and between the channel layers 204 of the upper device region 220. Block 1840 forms contacts to finish the device.

Having described preferred embodiments of work function metal patterning for nanosheet CFETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   a stack of channel layers, including an upper device region and a lower device region, wherein the upper device region is separated from the lower device region by a dielectric spacer layer;
   a first work function metal layer on the channel layers in the lower device region, wherein a height of the first work function metal layer does not rise above the dielectric spacer layer;
   a second work function metal layer on the channel layers in the upper device region;
   lower source/drain regions on sidewalls of the channel layers in the lower device region;
   upper source/drain regions on sidewalls of the channel layers in the upper device region;
   an isolation layer around the lower source/drain regions and the upper source/drain regions; and
   a bottom spacer between the lower source/drain regions and an underlying substrate, wherein the isolation layer makes contact with a side surface of the bottom spacer.

2. The semiconductor device of claim 1, further comprising a gate dielectric layer on the channel layers and on the dielectric spacer layer.

3. The semiconductor device of claim 2, wherein the gate dielectric layer and the dielectric spacer layer are formed from different dielectric materials.

4. The semiconductor device of claim 1, wherein the upper source/drain regions are patterned, such that at least a portion of the lower source/drain regions has no overlying epitaxial material.

5. The semiconductor device of claim 1, wherein the channel layers are each nanosheet semiconductor layers.

6. The semiconductor device of claim 1, wherein the first work function metal layer has a first conductivity type, and the second work function metal layer has a second conductivity type, different from the first conductivity type.

7. A semiconductor device, comprising:
 a stack of channel layers, including an upper device region and a lower device region, wherein the upper device region is separated from the lower device region by a dielectric spacer layer;
 a first work function metal layer on the channel layers in the lower device region, wherein a height of the first work function metal layer does not rise above the dielectric spacer layer;
 a second work function metal layer, on the channel layers in the upper device region, that extends down into the lower device region and contacts the first work function metal layer;
 lower source/drain regions on sidewalls of the channel layers in the lower device region;
 upper source/drain regions on sidewalls of the channel layers in the upper device region;
 an isolation layer around the lower source/drain regions and the upper source/drain regions; and
 a bottom spacer between the lower source/drain regions and an underlying substrate, wherein the isolation layer makes contact with a side surface of the bottom spacer.

8. The semiconductor device of claim 7, further comprising a gate dielectric layer on the channel layers and on the dielectric spacer layer.

9. The semiconductor device of claim 8, wherein the gate dielectric layer and the dielectric spacer layer are formed from different dielectric materials.

10. The semiconductor device of claim 7, wherein the upper source/drain regions are patterned, such that at least a portion of the lower source/drain regions has no overlying epitaxial material.

11. The semiconductor device of claim 7, wherein the channel layers are each nanosheet semiconductor layers.

12. The semiconductor device of claim 7, wherein the first work function metal layer has a first conductivity type, and the second work function metal layer has a second conductivity type, different from the first conductivity type.

13. A semiconductor device, comprising:
 a stack of nanosheet semiconductor channel layers, including an upper device region and a lower device region, wherein the upper device region is separated from the lower device region by a dielectric spacer layer;
 a first work function metal layer on the channel layers in the lower device region and having a first conductivity type, wherein a height of the first work function metal layer does not rise above the dielectric spacer layer;
 a second work function metal layer, on the channel layers in the upper device region and having a second conductivity type different from the first conductivity type, that extends down into the lower device region and contacts the first work function metal layer;
 lower source/drain regions on sidewalls of the channel layers in the lower device region;
 upper source/drain regions on sidewalls of the channel layers in the upper device region, patterned such that at least a portion of the lower source/drain regions has no overlying epitaxial material;
 an isolation layer around the lower source/drain regions and the upper source/drain regions; and
 a bottom spacer between the lower source/drain regions and an underlying substrate, wherein the isolation layer makes contact with a side surface of the bottom spacer.

* * * * *